(12) United States Patent
Denda et al.

(10) Patent No.: US 12,245,364 B2
(45) Date of Patent: Mar. 4, 2025

(54) WIRING BOARD AND ELECTRONIC DEVICE

(71) Applicant: SHINKO ELECTRIC INDUSTRIES CO., LTD., Nagano (JP)

(72) Inventors: Tatsuaki Denda, Nagano (JP); Takehito Terasawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 219 days.

(21) Appl. No.: 17/992,078

(22) Filed: Nov. 22, 2022

(65) Prior Publication Data

US 2023/0164908 A1    May 25, 2023

(30) Foreign Application Priority Data

Nov. 24, 2021   (JP) .................................. 2021-190262

(51) Int. Cl.
*H05K 1/02* (2006.01)
*H05K 1/03* (2006.01)

(52) U.S. Cl.
CPC ......... *H05K 1/0224* (2013.01); *H05K 1/0393* (2013.01); *H05K 2201/2081* (2013.01)

(58) Field of Classification Search
CPC .. H05K 1/0271; H05K 1/0225; H05K 1/0224; H05K 1/0227; H05K 1/0393
See application file for complete search history.

(56) References Cited

U.S. PATENT DOCUMENTS

2020/0161271 A1*   5/2020   Mori .................... H05K 1/0298

FOREIGN PATENT DOCUMENTS

JP            2020-088005          6/2020

* cited by examiner

*Primary Examiner* — Jeremy C Norris
(74) *Attorney, Agent, or Firm* — Rankin, Hill & Clark LLP

(57) ABSTRACT

A wiring board includes a plurality of insulating layers each being made of flexible insulating resin, and a conductor layer that is laminated on the plurality of insulating layers and that has a conductor pattern. The conductor layer includes a conductor pattern that has a certain shape in which a plurality of unit patterns are connected in plan view. The unit pattern includes a U-shaped pattern, an inverted U-shaped pattern that is arranged such that an opening side is located away from an opening side of the U-shaped pattern, and a straight line pattern that connects center portions of the U-shaped pattern and the inverted U-shaped pattern.

8 Claims, 7 Drawing Sheets

BENDING DIRECTION

BENDING DIRECTION

|  | UNIT PATTERN 310 | UNIT PATTERN 320 |
|---|---|---|
| REMAINING COPPER RATE | 44.6% | 44.6% |
| STRESS | 0.488 N | 0.562 N |
| BENDING MODULUS | 352 MPa | 407 MPa |
| MAXIMUM STRESS VALUE | 189 MPa | 195 MPa |

WIRING BOARD AND ELECTRONIC DEVICE

CROSS-REFERENCE TO RELATED APPLICATION

This application is based upon and claims the benefit of priority of the prior Japanese Patent Application No. 2021-190262, filed on Nov. 24, 2021, the entire contents of which are incorporated herein by reference.

FIELD

The embodiment discussed herein is related to a wiring board and an electronic device.

BACKGROUND

In general, a flexible substrate may be used as a wiring board in an electronic device, such as a wearable device, for example. The flexible substrate is a wiring board that has flexibility and that is usable in a bent state. The flexible substrate as described above is formed by laminating a wiring pattern, such as copper, on flexible insulating resin. In this case, if the wiring pattern is laminated on an entire surface of the insulating resin, bendability of the wiring board decreases, and therefore, for example, the wiring pattern is arranged in a predetermined shape with an interval to ensure the bendability of the wiring board.

Patent Literature 1: Japanese Laid-open Patent Publication No. 2020-088005

However, in the conventional flexible substrate, a remaining copper rate is reduced to ensure the bendability, so that it becomes difficult to control a thickness of the insulating resin and dimensional stability decreases, which is a problem. Specifically, with a decrease in the remaining copper rate that is a ratio of an area that is covered by the wiring pattern in the surface of the insulating resin, an area of the insulating resin that is exposed without being covered by the wiring pattern increases, so that the flexible substrate becomes easily bendable. In contrast, in a portion in which the insulating resin is exposed, it is difficult to keep a constant thickness due to fluidity of the insulating resin. As a result, a substrate thickness of the flexible substrate may vary or positional accuracy of the wiring pattern may be reduced, so that the remaining copper rate decreases and the dimensional stability also decreases.

SUMMARY

According to an aspect of an embodiment, a wiring board includes a plurality of insulating layers each being made of flexible insulating resin; and a conductor layer that is laminated on the plurality of insulating layers and that has a conductor pattern, wherein the conductor layer includes a conductor pattern that has a certain shape in which a plurality of unit patterns are connected in plan view, and each of the unit patterns includes a U-shaped pattern; an inverted U-shaped pattern that is arranged such that an opening side is located away from an opening side of the U-shaped pattern; and a straight line pattern that connects center portions of the U-shaped pattern and the inverted U-shaped pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

One embodiment of a wiring board and an electronic device disclosed in the present application will be described in detail below with reference to the drawings. The present invention is not limited by the embodiment below.

Figure 1:
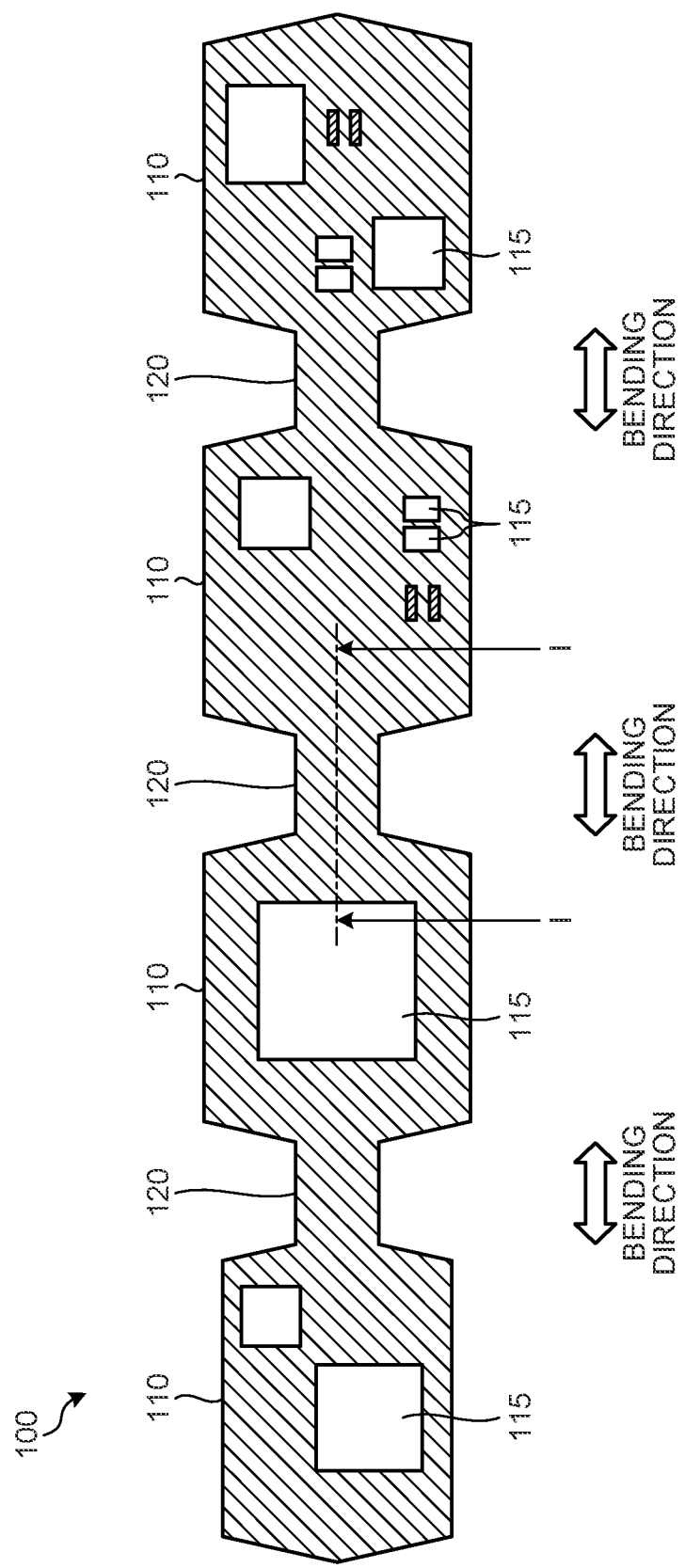
FIG. 1 is a diagram illustrating an external appearance of an electronic device according to one embodiment.

FIG. 1 is a diagram illustrating an external appearance of an electronic device 100 according to one embodiment. The electronic device 100 illustrated in FIG. 1 is, for example, a wearable device that is wearable on a human body, and can be wound around an arm or a leg by being bent in a longitudinal direction, for example. The electronic device 100 is constructed by mounting an electronic component on a wiring board that is configured with a flexible substrate. Specifically, the wiring board includes mounting units 110 and connecting units 120, and electronic components 115 are mounted on the mounting units 110.

The mounting units 110 are regions that are spread in a planar manner so as to have predetermined areas and that have surfaces on which the electronic components 115 are mountable. In the example illustrated in FIG. 1, the wiring board includes the plurality of mounting units 110, and the mounting units 110 are connected to one another by the connecting units 120.

The electronic components 115 include, for example, a semiconductor device, a chip part (a chip condenser, a chip resistor, a chip inductor, or the like), a crystal oscillator, and the like. The electronic components 115 are mounted on the mounting units 110 and electrically connected to a conductor layer of the wiring board (to be described later).

The connecting units 120 connect the mounting units 110 and are formed in a bendable manner. Specifically, the connecting units 120 connect the adjacent mounting units 110 and bend such that the mounting units 110 approach each other, so that the entire electronic device 100 bends in a longitudinal direction. In other words, the wiring board includes at least the two mounting units 110 and the connecting unit 120 that connects the two mounting units 110, and the wiring board bends in a direction in which the mounting units 110 are connected by a straight line.

Figure 2:
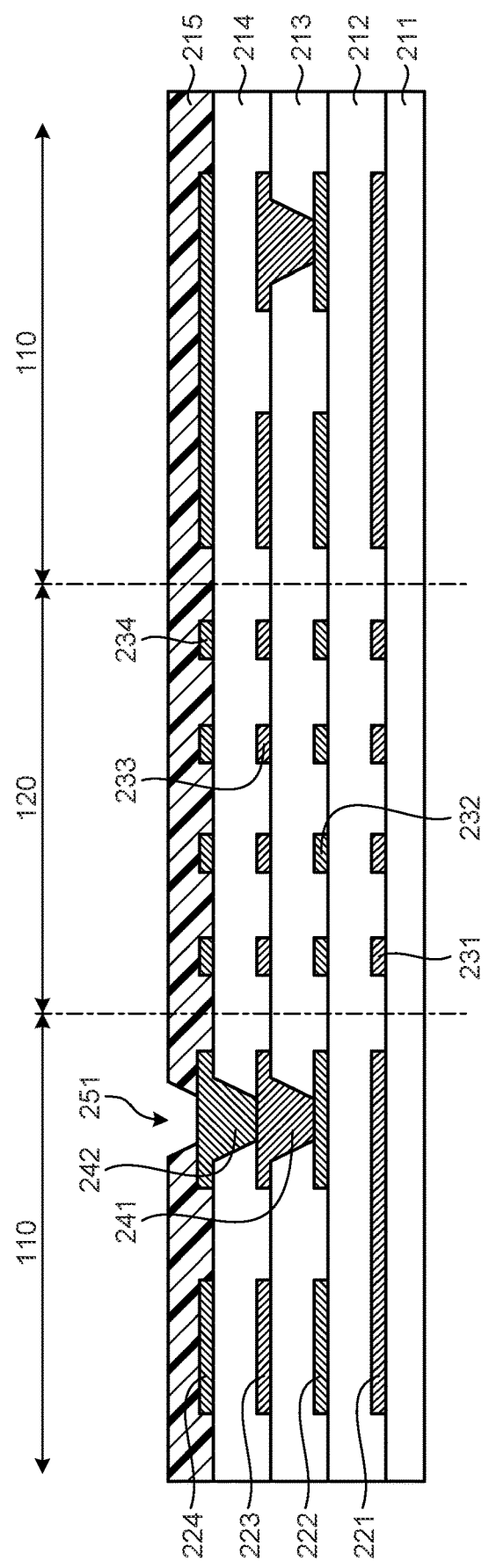
FIG. 2 is a cross-sectional view illustrating a wiring board according to one embodiment.

FIG. 2 is a cross-sectional view of the wiring board cut along a line I-I in FIG. 1. As illustrated in FIG. 2, the wiring board is a multilayer substrate in which insulating layers and conductor layers are laminated. Specifically, the wiring board includes insulating layers 211 to 215, conductor layers 221 to 224, and conductor layers 231 to 234.

The insulating layers 211 to 214 are formed by using, for example, flexible insulating resin, such as epoxy resin or polyimide resin, and thicknesses of the insulating layers 211 to 214 may be set to, for example, about 20 to 45 micrometers (μm).

The conductor layers 221 to 224 are conductor layers that are formed on the mounting units 110, and formed on upper surfaces of the insulating layers 211 to 214, respectively. The conductor layers 221 to 224 include wiring patterns for transmitting electrical signals, and ground patterns connected to a ground power supply (not illustrated). The wiring patterns of the different conductor layers 221 to 224 are electrically connected by vias 241 and 242 that penetrate through the insulating layers 211 to 214. Further, the ground patterns of the conductor layers 221 to 224 are spread in a planar manner, and cover upper surfaces of the insulating layers 211 to 214 in a planar manner. The conductor layers 221 to 224 are formed by using, for example, copper or a copper alloy, and thicknesses of the conductor layers 221 to 224 may be set to, for example, about 10 to 20 μm.

The conductor layers 231 to 234 are conductor layers that are formed on the connecting units 120, and formed on upper surfaces of the insulating layers 211 to 214, respectively. The conductor layers 231 to 234 include wiring patterns for transmitting electrical signals, and ground patterns connected to a ground power supply (not illustrated). In the connecting units 120, the wiring patterns of the different conductor layers 231 to 234 are not connected by a via, but the wiring patterns of the conductor layers 231 to 234 are electrically connected to wiring patterns of the conductor layers 221 to 224 in the adjacent mounting units 110. Further, in the connecting units 120, the ground patterns of the conductor layers 231 to 234 do not completely cover the upper surfaces of the insulating layers 211 to 214, but are formed in shapes with intervals. Shapes of the ground patterns of the conductor layers 231 to 234 will be described in detail later. The conductor layers 231 to 234 are formed by using, for example, copper or a copper alloy, and thicknesses of the conductor layers 231 to 234 may be set to, for example, about 10 to 20 μm.

The insulating layer 215 is a solder resist layer, and is formed by using flexible insulating resin, such as phenolic resin or polyimide resin, for example. The insulating layer 215 may be formed by using the same insulating resin as the insulating layers 211 to 214, and a thickness of the insulating layer 215 may be set to, for example, about 15 to 35 μm.

The insulating layer 211 is a layer that forms a lowermost layer of the wiring board, and the conductor layer 221 and the conductor layer 231 are formed on an upper surface thereof. The conductor layer 221 and the conductor layer 231 are formed on the upper surface of the insulating layer 211 by, for example, the subtractive method or the semi-additive method. The conductor layer 231 is mainly configured with a ground pattern, and formed in a certain shape that exposes the upper surface of the insulating layer 211 so as to maintain the bendability of the connecting unit 120.

The insulating layer 212 is a layer that covers the conductor layer 221 and the conductor layer 231, and the conductor layer 222 and the conductor layer 232 are formed on an upper surface thereof. The conductor layer 222 and the conductor layer 232 are formed on the upper surface of the insulating layer 212 by, for example, the subtractive method or the semi-additive method. The conductor layer 232 is mainly configured with a ground pattern, and formed in a certain shape that exposes the upper surface of the insulating layer 212 so as to maintain the bendability of the connecting unit 120.

The insulating layer 213 is a layer that covers the conductor layer 222 and the conductor layer 232, and the conductor layer 223 and the conductor layer 233 are formed on an upper surface thereof. The conductor layer 223 and the conductor layer 233 are formed on the upper surface of the insulating layer 213 by, for example, the subtractive method or the semi-additive method. A wiring pattern of the conductor layer 223 is electrically connected to, for example, a wiring pattern of the conductor layer 222 via the via 241. Specifically, the via 241 penetrate through the insulating layer 213 and connects the wiring patterns of the different layers. The conductor layer 233 is mainly configured with a ground pattern, and formed in a certain shape that exposes the upper surface of the insulating layer 213 so as to maintain the bendability of the connecting unit 120.

The insulating layer 214 is a layer that covers the conductor layer 223 and the conductor layer 233, and the conductor layer 224 and the conductor layer 234 are formed on an upper surface thereof. The conductor layer 224 and the conductor layer 234 are formed on the upper surface of the insulating layer 214 by, for example, the subtractive method or the semi-additive method. A wiring pattern of the conductor layer 224 is electrically connected to, for example, a wiring pattern of the conductor layer 223 via the via 242. Specifically, the via 242 penetrates through the insulating layer 214 and connects the wiring patterns of the different layers. The conductor layer 234 is mainly configured with a ground pattern, and formed in a certain shape that exposes the upper surface of the insulating layer 214 so as to maintain the bendability of the connecting unit 120.

The insulating layer 215 covers the conductor layer 224 and the conductor layer 234. In the mounting unit 110, an opening portion 251 is formed in a part of the insulating layer 215 and exposes the upper surface of the conductor layer 224. It is possible to electrically connect a terminal of the electronic component 115 to the conductor layer 224 that is exposed from the opening portion 251.

Figure 3A:
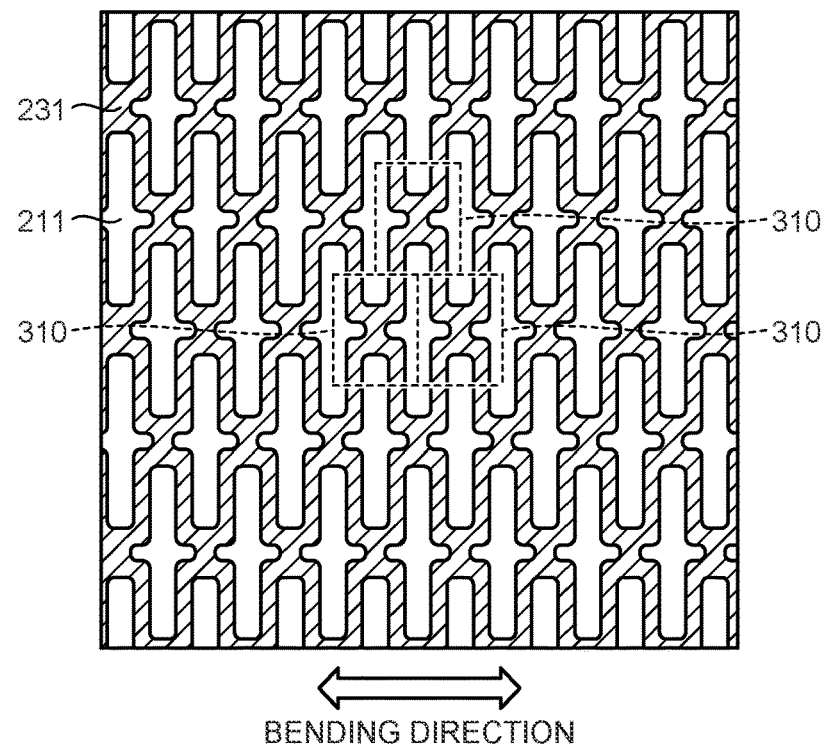
FIG. 3A is a diagram for explaining a shape of a ground pattern.

Shapes of the ground patterns of the conductor layers 231 to 234 in the connecting unit 120 will be described below with reference to FIG. 3A to FIG. 5. FIG. 3A is a plan view illustrating the shape of the conductor layer 231 that is formed on the upper surface of the insulating layer 211 in the connecting unit 120. In FIG. 3A, a left-right direction corresponds to the longitudinal direction of the electronic device 100 and serve as a bending direction of the connecting unit 120.

Figure 3B:
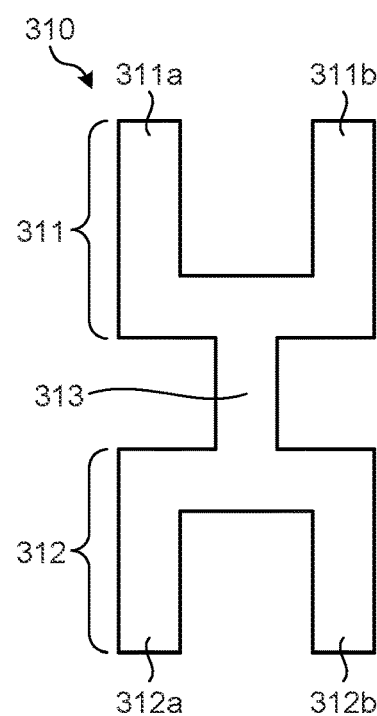
FIG. 3B is a diagram for explaining a shape of a ground pattern.

As illustrated in FIG. 3A, the ground pattern of the conductor layer 231 has a certain shape in which a plurality of unit patterns 310 are connected in plan view. Meanwhile, the plan view is a viewpoint at which the surface of the insulating layer 211 on which the conductor layer 231 is formed is viewed from a vertical direction. As illustrated in FIG. 3B, each of the unit patterns 310 has a certain shape in which center portions of a U-shaped pattern 311 and an inverted U-shaped pattern 312 that are arranged such that respective opening sides are located away from each other are connected by a straight line pattern 313. The bending direction of the connecting unit 120 is perpendicular to the straight line pattern 313 included in the unit pattern 310.

Here, "perpendicular" indicates not only a state in which the bending direction of the wiring board and the straight line pattern 313 cross each other at a right angle, but also a state in which the bending direction of the wiring board and the straight line pattern 313 cross each other at an angle in a predetermine range including the right angle.

In the ground pattern of the conductor layer 231, one end 311a of a U-shaped pattern 311 of a first unit pattern 310 is connected to one end 312b of an inverted U-shaped pattern 312 of a second unit pattern 310 that is located in the upper left, and one end 311b of the U-shaped pattern 311 of the first unit pattern 310 is connected to one end 312a of an inverted U-shaped pattern 312 of a third unit pattern 310 that is located in the upper right. Similarly, one end 312a of an inverted U-shaped pattern 312 of the first unit pattern 310 is connected to one end 311b of a U-shaped pattern 311 of a fourth unit pattern 310 that is located in the lower left, and one end 312b of the inverted U-shaped pattern 312 of the first unit pattern 310 is connected to one end 311a of a U-shaped pattern 311 of a fifth unit pattern 310 that is located in the lower right.

In this manner, by adopting the shape in which the unit patterns 310 are connected, the ground pattern of the conductor layer 231 has a certain shape in which a conductor pattern that extends in a top-bottom direction perpendicular to the bending direction alternately includes a portion that protrudes to the right and a portion that protrudes to the left. Further, the portion that protrudes to the right in the conductor pattern extending in the top-bottom direction is connected to a portion that protrudes to the left in a conductor pattern that is located adjacently on the right side, and the portion that protrudes to the left in the conductor pattern extending in the top-bottom direction is connected to a portion that protrudes to the right in a conductor pattern that is located adjacently on the left side.

Furthermore, in the conductor layer 231, the insulating layer 211 is exposed from vertically long cross-shaped regions surrounded by the ground pattern. By providing the regions in which the insulating layer 211 is exposed, it is possible to ensure the bendability of the connecting unit 120 due to the flexibility of the insulating resin. Moreover, a region in which the insulating layer 211 is exposed is divided into small regions that are surrounded by the ground pattern, so that it is possible to maintain a constant thickness of the insulating layer 212 that covers the conductor layer 231 for each of the small regions. Furthermore, in this shape, a relatively large number of conductor patterns are arranged in the vicinity of the straight line pattern 313 of the unit pattern 310, so that it is possible to increase the remaining copper rate that is a ratio of an area that is covered by the conductor layer 231 in the upper surface of the insulating layer 211. As a result, it is possible to prevent variation in a substrate thickness of the wiring board, and it is possible to improve positional accuracy of the wiring pattern. In other words, it is possible to maintain the bendability and ensure dimensional stability.

Figure 4:
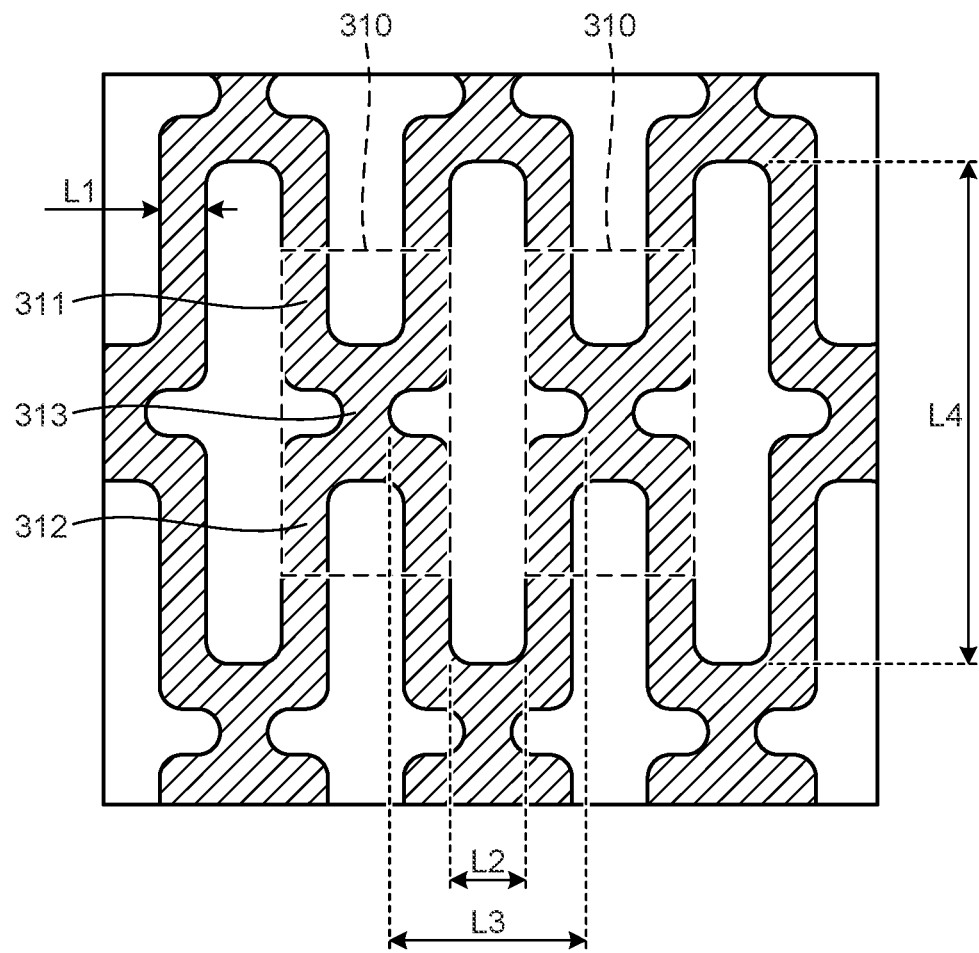
FIG. 4 is a diagram for explaining dimensions of the ground pattern.

Here, as illustrated in FIG. 4, a width L1 of the conductor pattern that forms the ground pattern of the conductor layer 231 may be set to, for example, about 25 to 100 μm. Further, a width L2 of a narrow portion of the vertically long cross-shaped region in which the insulating layer 211 is exposed may be set to, for example, about 50 to 150 μm. Furthermore, a width L3 of a wide portion of the vertically long cross-shaped region in which the insulating layer 211 is exposed may be set to, for example, about 100 to 350 μm. A height L4 of the vertically long cross-shaped region in which the insulating layer 211 is exposed may be set to, for example, about 500 to 700 μm.

Figure 5:
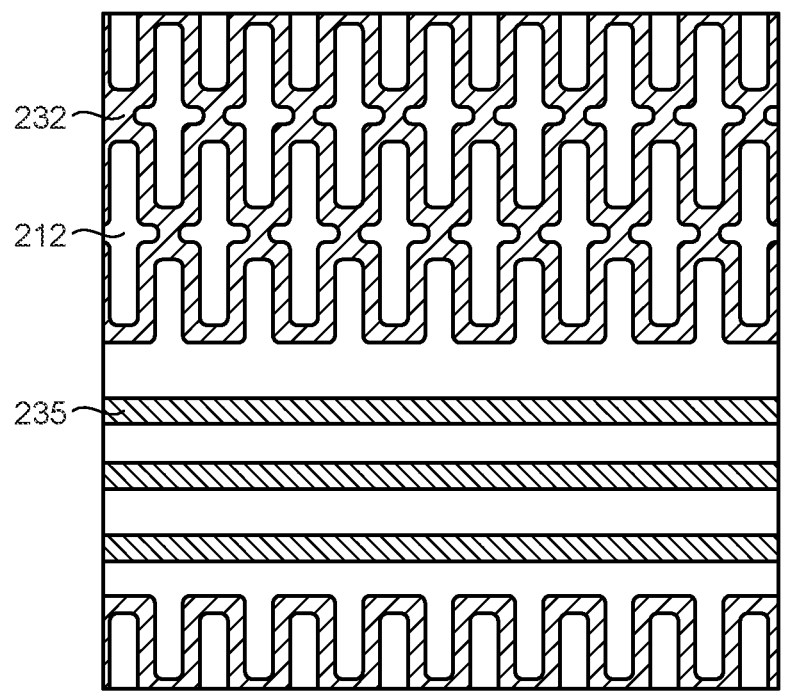
FIG. 5 is a plan view illustrating a specific example of a conductor layer.

Meanwhile, in the connecting unit 120, only the ground pattern is formed in the conductor layer 231, but wiring patterns for transmitting electrical signals between the adjacent mounting units 110 may be formed in the conductor layers 231 to 234. Specifically, as illustrated in FIG. 5 for example, a wiring pattern 235 is formed on the conductor layer 232 that is formed on the upper surface of the insulating layer 212, in addition to the same ground pattern as the ground pattern of the conductor layer 231 as described above.

The wiring pattern 235 transmits an electrical signal between the adjacent mounting units 110. Specifically, the wiring pattern 235 connects the conductor layers 222 of the two mounting units 110 that are connected to each other by the connecting unit 120, and an electrical signal is transmitted between the conductor layers 222 of the adjacent mounting units 110. In the conductor layer 232, a ground pattern is formed in a region in which the wiring pattern 235 is not formed, similarly to the conductor layer 231. The ground pattern may be connected to the ground patterns of the conductor layers 222 of the adjacent mounting units 110.

A ground pattern is formed on each of the entire conductor layers 231 to 234 of the connecting unit 120 in the same manner as the conductor layer 231 as described above, or a wiring pattern is formed in a part of each of the conductor layers 231 to 234 on an as-needed basis in the same manner as the conductor layer 232. It is preferable to form the wiring patterns in the conductor layers 232 and 233 except for the conductor layer 231 that is the lowermost layer and the conductor layer 234 that is the uppermost layer.

The bendability of the ground pattern according to one embodiment will be described below by using a specific example.

As described above, the ground pattern in each of the conductor layers 231 to 234 of the connecting unit 120 according to the present embodiment has a certain shape in which the unit patterns 310 are connected. Each of the unit patterns 310 has a certain shape in which the center portions of the U-shaped pattern 311 and the inverted U-shaped pattern 312 that are arranged such that the respective opening sides are located away from each other are connected by the straight line pattern 313.

Figures 6A, 6B:
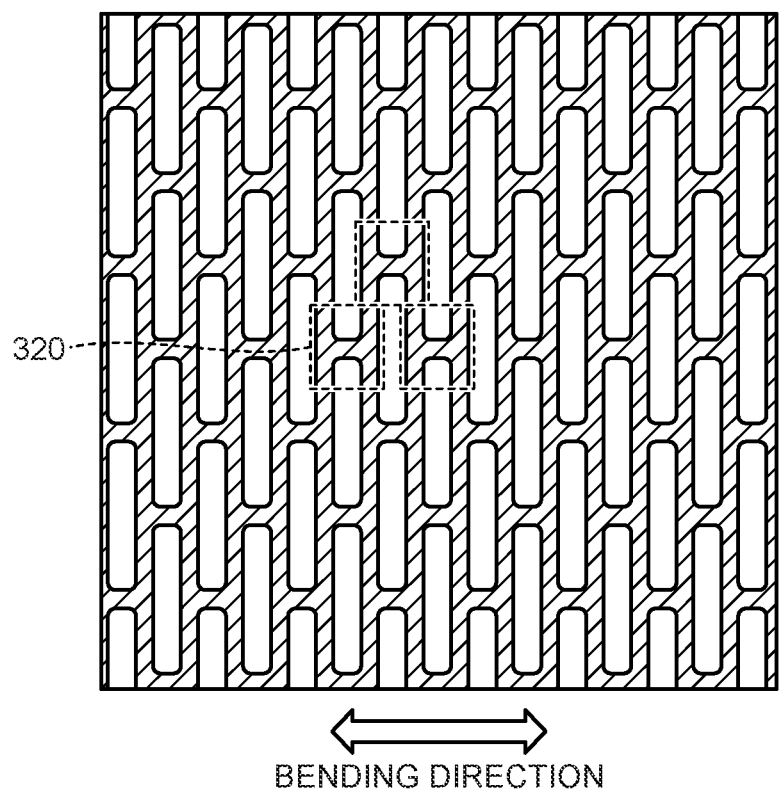
FIG. 6A is a diagram illustrating a specific example of another ground pattern.
FIG. 6B is a diagram illustrating a specific example of another ground pattern.

In contrast, as illustrated in FIG. 6A for example, it may be possible to form a ground pattern that has a certain shape in which H-shaped unit patterns 320 are connected. FIG. 6B illustrates verification results that are obtained by a bendability analysis tool with respect to the ground pattern in which the unit patterns 310 according to the present embodiment are connected, and the ground pattern in which the unit patterns 320 are connected as illustrated in FIG. 6A.

In FIG. 6B, the remaining copper rate is set to the same value of 44.6% for the case in which the unit patterns 310 are adopted and the case in which the unit patterns 320 are adopted. Even if the remaining copper rate is the same as described above, in the case in which the unit patterns 310 are adopted, the bending modulus is 352 megapascal (MPa), which is smaller than the bending modulus of 407 MPa in the case in which the unit patterns 320 are adopted. At the same time, a reaction force and a maximum stress value are reduced in the case in which the unit patterns 310 are adopted, as compared to the case in which the unit patterns 320 are adopted.

This indicates that, when the unit patterns 310 are adopted, it is possible to bend the connecting unit 120 with a reduced force and it is possible to ensure good bendability of the connecting unit 120 according to the present embodiment.

Figure 7A:
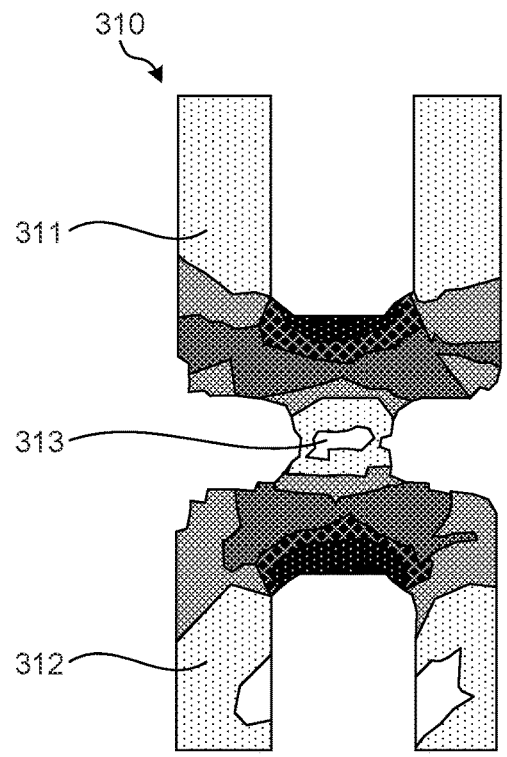
FIG. 7A is a diagram illustrating stress distributions of unit patterns.
Figure 7B:
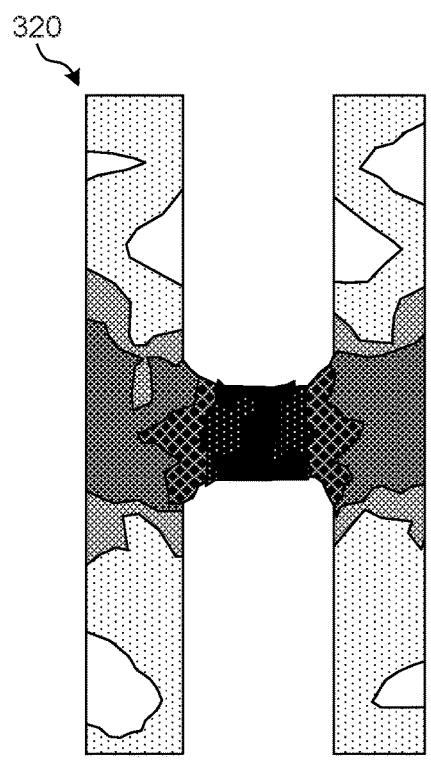
FIG. 7B is a diagram illustrating stress distributions of unit patterns.

FIGS. 7A and 7B are diagrams illustrating a specific example of stress distributions of the unit patterns 310 and 320. Specifically, FIG. 7A illustrates the stress distribution of the unit pattern 310, and FIG. 7B illustrates the stress distribution of the unit pattern 320. In FIGS. 7A and 7B, darker portions represent higher stress.

As illustrated in FIGS. 7A and 7B, in the unit pattern 320, the stress is concentrated in a center portion in the H-shape, whereas the stress is relatively distributed without being concentrated in the straight line pattern 313 in the unit pattern 310. This may occur because if the unit pattern 310 is pulled in the left-right direction when being bent in the bending direction, the U-shaped pattern 311 and the inverted U-shaped pattern 312 are relatively easily stretched in the left-right direction, so that the stress is distributed.

In this manner, the stress at the time of bending is distributed due to the shape of the unit pattern 310, so that if the ground pattern of the connecting unit 120 is formed into the shape in which the unit patterns 310 are connected, it is possible to ensure the preferable bendability of the connecting unit 120.

As described above, according to the present embodiment, in the conductor layer that is formed on the upper surface of the insulating layer of the multilayer wiring board, the ground pattern in which the plurality of unit patterns are connected is formed. Further, each of the unit patterns has a certain shape in which the U-shaped pattern and the inverted U-shaped pattern are arranged such that the respective opening sides are located away from each other and the center portions of the U-shaped pattern and the inverted U-shaped pattern are connected by the straight line pattern. Therefore, even if a ratio of the area that is covered by the conductor layer in the upper surface of the insulating layer is increased, it is possible to distribute the stress that is applied to each of the unit patterns when the wiring board bends, so that it is possible to maintain the flexibility and ensure the dimensional stability.

Meanwhile, in one embodiment as described above, the four-layer wiring board including the insulating layers 211 to 214, the conductor layers 221 to 224, and the conductor layers 231 to 234 is described as an example, but the number of layers of the wiring board is not limited to this example. As long as the wiring board has a configuration in which the conductor layer is laminated on the insulating layer, it is possible to maintain the bendability of the wiring board and ensure the dimensional stability regardless of the number of the layers by forming the conductor pattern into a certain shape in which the unit patterns 310 are connected.

According to one embodiment of the wiring board and the electronic device disclosed in the present application, it is possible to maintain the bendability and ensure the dimensional stability.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring board comprising:
a plurality of insulating layers each being made of flexible insulating resin; and
a conductor layer that is laminated on the plurality of insulating layers and that has a conductor pattern, wherein
the conductor pattern has a certain shape in which a plurality of unit patterns are connected in plan view,
each of the unit patterns includes
a U-shaped pattern;
an inverted U-shaped pattern that is arranged such that an opening side is located away from an opening side of the U-shaped pattern; and
a straight line pattern that connects center portions of the U-shaped pattern and the inverted U-shaped pattern, and
in the certain shape of the conductor pattern, one end of the U-shaped pattern of a first unit pattern is connected to one end of the inverted U-shaped pattern of a second unit pattern, another end of the U-shaped pattern of the first unit pattern is connected to one end of the inverted U-shaped pattern of a third unit pattern, one end of the inverted U-shaped pattern of a fourth unit pattern is connected to one end of the U-shaped pattern of the second unit pattern, and another end of the inverted U-shaped pattern of the fourth unit pattern is connected to one end of the U-shaped pattern of the third unit pattern.

2. The wiring board according to claim 1, wherein the conductor pattern is a ground pattern that is connected to a ground power supply.

3. The wiring board according to claim 1, wherein the conductor layer further includes a wiring pattern for transmitting an electrical signal.

4. The wiring board according to claim 1, wherein
the conductor layer is formed of a plurality of conductor layers laminated on the plurality of insulating layers, and
the wiring board further comprising:
a solder resist layer that covers a topmost conductor layer among the plurality of conductor layers.

5. The wiring board according to claim 1, wherein
the wiring board includes
at least two mounting units for mounting electronic components; and
a connecting unit that connects the mounting units, and
the conductor pattern having the shape in which the plurality of unit patterns are connected is formed on a conductor layer of the connecting unit.

6. The wiring board according to claim 5, wherein the straight line pattern included in the unit pattern is perpendicular to a longitudinal direction of the connecting unit.

7. The wiring board according to claim 5, wherein the straight line pattern included in the unit pattern is perpendicular to a direction in which the mounting units are connected by a straight line.

8. An electronic device comprising:
a wiring board; and
an electronic component that is mounted on the wiring board, wherein
the wiring board includes
a plurality of insulating layers each being made of flexible insulating resin; and
a conductor layer that is laminated on the plurality of insulating layers and that has a conductor pattern, the conductor pattern that has a certain shape in which a plurality of unit patterns are connected in plan view, each of the unit patterns includes
- a U-shaped pattern;
- an inverted U-shaped pattern that is arranged such that an opening side is located away from an opening side of the U-shaped pattern;
- a straight line pattern that connects center portions of the U-shaped pattern and the inverted U-shaped pattern, and in the certain shape of the conductor pattern, one end of the U-shaped pattern of a first unit pattern is connected to one end of the inverted U-shaped pattern of a second unit pattern, another end of the U-shaped pattern of the first unit pattern is connected to one end of the inverted U-shaped pattern of a third unit pattern, one end of the inverted U-shaped pattern of a fourth unit pattern is connected to one end of the U-shaped pattern of the second unit pattern, and another end of the inverted U-shaped pattern of the fourth unit pattern is connected to one end of the U-shaped pattern of the third unit pattern.

* * * * *